United States Patent [19]

Freeman et al.

[11] Patent Number: 5,594,363

[45] Date of Patent: Jan. 14, 1997

[54] LOGIC CELL AND ROUTING ARCHITECTURE IN A FIELD PROGRAMMABLE GATE ARRAY

[75] Inventors: Richard D. Freeman, San Carlos; Joseph D. Linoff, San Jose; Timothy Saxe, Los Altos, all of Calif.

[73] Assignee: Zycad Corporation, Fremont, Calif.

[21] Appl. No.: 418,972

[22] Filed: Apr. 7, 1995

[51] Int. Cl.[6] .............................................. H03K 19/177
[52] U.S. Cl. ................................................ 326/39; 326/41
[58] Field of Search ....................................... 326/39, 41

[56] References Cited

U.S. PATENT DOCUMENTS

| | | | |
|---|---|---|---|
| 5,245,227 | 9/1993 | Furtek et al. | 326/39 |
| 5,430,390 | 7/1995 | Chan et al. | 326/39 |
| 5,451,887 | 9/1995 | El-Avat et al. | 326/41 |
| 5,477,165 | 12/1995 | ElAyat et al. | 326/41 |
| 5,479,113 | 12/1995 | Gamal et al. | 326/41 |
| 5,498,978 | 3/1996 | Takahashi et al. | 326/41 |
| 5,504,440 | 4/1996 | Sasaki | 326/41 |

*Primary Examiner*—David R. Hudspeth
*Assistant Examiner*—Richard Roseen
*Attorney, Agent, or Firm*—Townsend and Townsend and Crew LLP; Henry K. Woodward

[57] ABSTRACT

The present invention provides for an FPGA integrated circuit having an array of logic cells and interconnect lines interconnected by programmable switches, each formed from a nonvolatile memory cell. The logic cell is designed to provide logic or memory functions according to the setting of programmable switches within the cell. The logic cells in the array are interconnectable by a hierarchy of local, long and global wiring segments. The interconnections are made by the setting of programmable switches between the wiring segments.

35 Claims, 12 Drawing Sheets

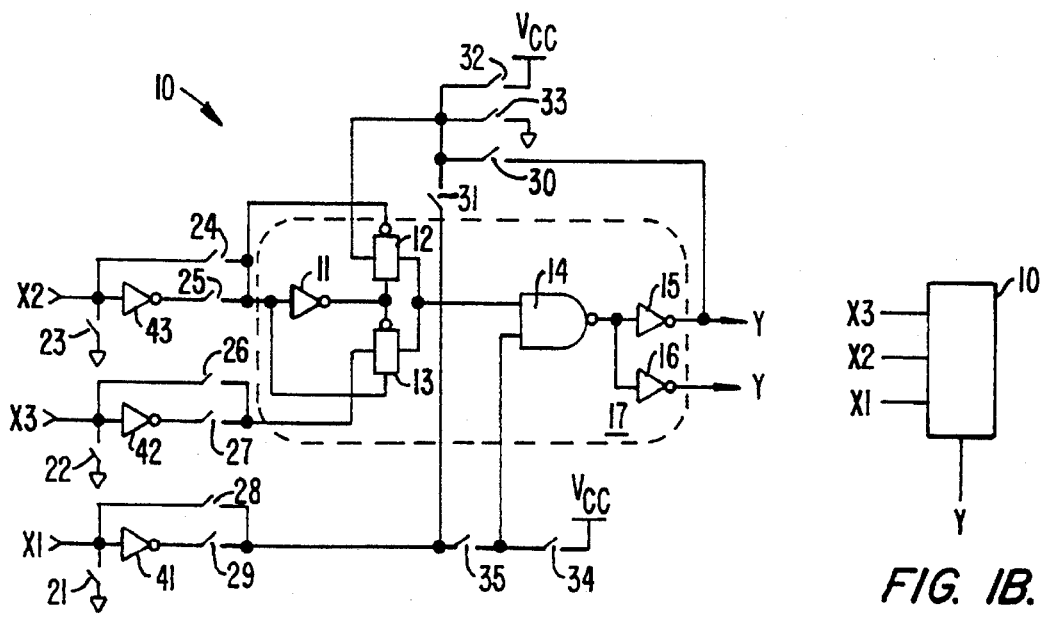

MAPPING FOR LOGIC BLOCK FUNCTION PROGRAMMING

| PROGRAMMABLE INTERCONNECT | DESCRIPTION |
|---|---|
| 21 | X1=0 |
| 22 | X3=0 |
| 23 | X2=0 |
| 24 | X2 |
| 25 | $\overline{X2}$ |
| 26 | X3 |
| 27 | $\overline{X3}$ |
| 28 | X1 |
| 29 | $\overline{X1}$ |
| 30 | Feedback On |
| 31 | Create a simple mux with A=X1, B=X3, and S=X2, see the description of #35 for more details. |
| 32 | Mux A==0, used for logic function programming. |
| 33 | Mux A==1, used for logic function programming. |
| 34 | Don't let an input to the NAND gate float, make it a buffer for the mux (see description for #35). |
| 35 | #35=0, #34=1, #31=1 causes X1 to be a B input on MUX. |

FIG. 2.

| NAME | EN | SET | CLR |
|------|----|----|-----|
| ldh | H | – | – |
| ldhbh | H | H | H |
| ldhbl | H | L | L |
| ldhch | H | – | H |
| ldhcl | H | – | L |
| ldhsh | H | H | – |
| ldhsl | H | L | – |
| ldl | L | – | – |
| ldlbh | L | H | H |
| ldlbl | L | L | L |
| ldlch | L | – | H |
| ldlcl | L | – | L |
| ldlsh | L | H | – |
| ldlsl | L | L | – | ld ----
    └── SET/CLR BIAS (H=ACTIVE HIGH, L=ACTIVE LOW)
   └── S=SET, C=CLEAR, B=BOTH SET AND CLEAR
  └── EN (H==ACTIVE HIGH, L=ACTIVE LOW)
 └── PREFIX TO INDICATE A LATCH

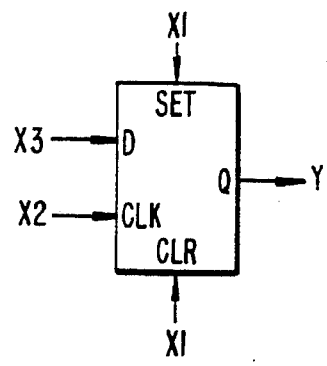
FIG. 5A.
| NAME | CLK | SET | CLR | D |
|---|---|---|---|---|
| dff | H | – | – | D |
| dffb | H | H | H | D |
| dffbf | H | H | H | -D |
| dffbl | H | L | L | D |
| dffblf | H | L | L | -D |
| dffc | H | – | H | D |
| dffcf | H | – | H | -D |
| dffcl | H | – | L | D |
| dffclf | H | – | L | -D |
| dfff | H | – | – | -D |
| dffs | H | H | – | D |
| dffsf | H | H | – | -D |
| dffsl | H | L | – | D |
| dffslf | H | L | – | -D |
| dffl | L | – | – | D |
| dfflb | L | H | H | D |
| dfflbf | L | H | H | -D |
| dfflbl | L | L | L | D |
| dfflblf | L | L | L | -D |
| dfflc | L | – | H | D |
| dfflcf | L | – | H | -D |
| dfflcl | L | – | L | D |
| dfflclf | L | – | L | -D |
| dfflf | L | – | – | -D |
| dffls | L | H | – | D |
| dfflsf | L | H | – | -D |
| dfflsl | L | L | – | D |
| dfflslf | L | L | – | -D |
FIG. 5B.
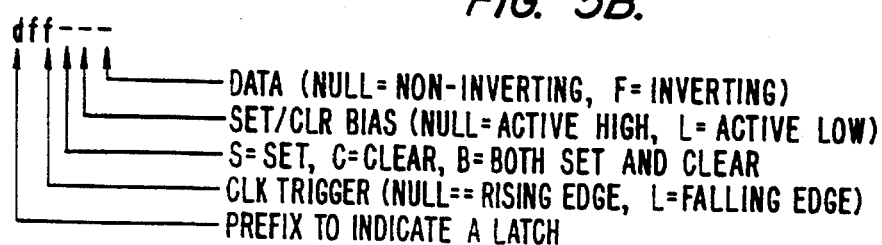
FIG. 5C.

FOCAL CELL

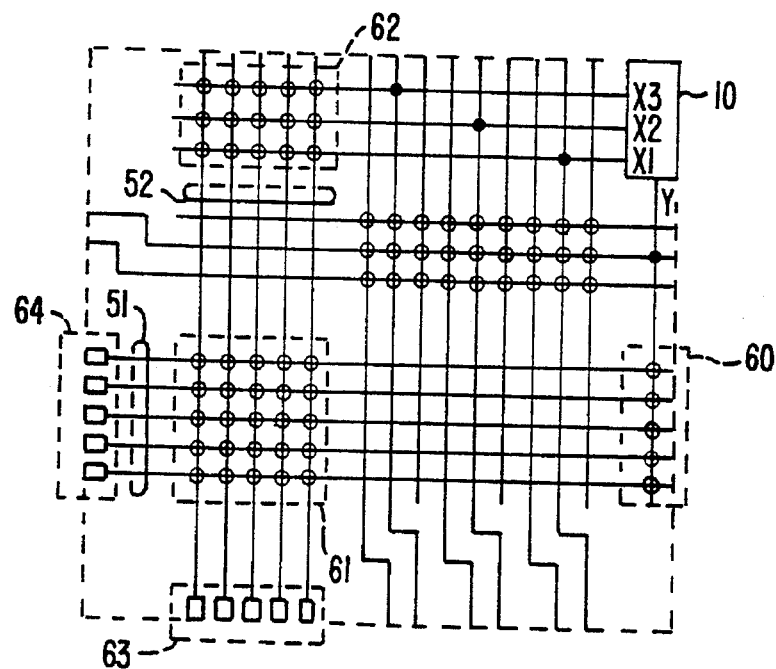
FIG. 11.
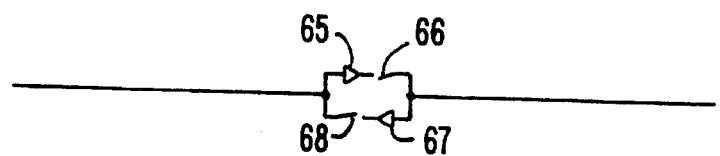
FIG. 12A.
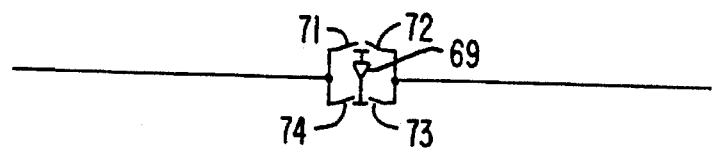
FIG. 12B.
FIG. 12C.

5,594,363

LOGIC CELL AND ROUTING ARCHITECTURE IN A FIELD PROGRAMMABLE GATE ARRAY

BACKGROUND OF THE INVENTION

The present invention is related to field programmable integrated circuits, and more particularly, to Field Programmable Gate Arrays (FPGAs).

Typically, an FPGA has an array of logic elements and wiring interconnections with many thousands, or even hundreds of thousands, of programmable switches so that the FPGA can be configured by the user into an integrated circuit with defined functions. Each programmable switch, or interconnect, can connect two circuit nodes in the integrated circuit to make (or break) a wiring interconnection, or to set the function or functions of a logic element.

Basic considerations in the architecture of all FPGAs are the complexity of the logic element, and the placement and routing of the wiring interconnecting the arrayed logic elements. A highly complex logic cell may be able to perform a large number of sophisticated operations. However, if a relatively simple operation, such as that of a NOR gate, is required by the FPGA user, much of the functionality and occupied space of the logic cell is wasted. On the other hand, a single transistor as a "logic cell" requires the use of valuable wiring resources to other "logic cells" before any functionality is achieved. Thus a balance must be reached between functionality and flexibility, based upon the likelihood of utilization by the user of the FPGA.

Related to the design of the logic cell in the array is the placement and routing of the wiring in the FPGA. The wiring should be designed so that the likelihood of use of each wiring segment is maximized, yet the use of wiring segments for one purpose should not be a bottleneck to wiring connections for other purposes. Furthermore, the ease of use of the routing of the wiring and the operating speeds of the configured FPGA are other considerations in the design. These factors must be weighed and balanced.

The present invention is a solution to the problem of FPGA architecture design. With the present invention, the logic cell and wiring are designed so that an FPGA with a high degrees of functionality, flexibility, utilization, ease of use and operating speeds is possible. Many of the issues which have plagued FPGA architecture are solved or mitigated.

SUMMARY OF THE INVENTION

The present invention provides for an integrated circuit having a plurality of logic cells, interconnect lines and switches for programmably connecting the logic cells and interconnect lines. Each logic cell comprises two transfer gates, each transfer gate having an input node, two control terminals which are programmably connectable to a first true or inverted signal, or to a fixed logic level, and an output node connected in common to the other transfer gate. An input node of the first transfer gate is programmably connectable to a fixed logic level or a feedback output signal from the logic cell. An input node of the second transfer gate is programmably connectable to a second true or inverted signal, or to a fixed logic level. The cell also has a logic gate having a plurality of input nodes, a first input node connected to the commonly connected output nodes of the transfer gates and a second input node programmably connectable to a third true or inverted signal, or to a fixed logic level, and an output node for carrying the logic cell output signal. These "logic" cells, individually or severally, may be programmed to provide logic or memory functions to configure the integrated circuit.

The present invention also provides for an integrated circuit having an array of tiles, each tile comprising a logic cell having input and output terminals; a plurality of local interconnect lines; and a plurality of switches for programmably connecting the local interconnect lines and the input and output terminals of the logic cell. The local interconnect lines are arranged such that an output terminal of the logic cell is uniquely programmably connectable to each input terminal of a logic cell in each contiguous tile.

In another aspect, the present invention provides for an integrated circuit having an array of tiles, each tile comprising a logic cell having input and output terminals; a plurality of interconnect lines; and a plurality of switches for programmably connecting the interconnect lines and the input and output terminals of said logic cell. The tile includes a first set of long interconnect lines generally aligned in a first direction, each logic cell output terminal programmably connectable to each one of the first set long interconnect lines and a second set of long interconnect lines generally aligned in a second direction perpendicular to the first direction, each of said second set long interconnect lines intersecting and programmably connectable to each of the first set long interconnect lines, and each logic cell input terminal programmably connectable to each one of the second set long interconnect lines.

For global signals, such as clock signals, the present invention also provides an integrated circuit having a plurality of logic cells arranged in rows and columns, each logic cell having input and output terminals. The integrated circuit has first global interconnect lines running through the array parallel to the columns and second global interconnect lines running through each row of the logic cells perpendicular to and intersecting the first global interconnect lines. The second global interconnect lines in a row are programmably connectable to at least one of the input terminals of each logic cell in the row, and to at least one of the input terminals of each logic cell in a neighboring row. The second global interconnect lines are alternately programmably connectable to first and second subsets of the first global interconnect lines in alternating rows of the logic cells. This permits each logic cell to be programmably connectable through the one input terminal to any of the first global interconnect lines.

BRIEF DESCRIPTION OF THE DRAWINGS

FIG. 1A is a diagram of a logic cell and its connections according to one embodiment of the present invention; FIG. 1B is symbolic representation of the logic cell of FIG. 1A.

FIG. 2 is a table of programmable switches and their operation with respect to the logic cell of FIG. 1A.

FIG. 5A represents the logic cell 10 of FIG. 1A as a D-type flip-flop; FIG. 5B is a list of 28 different possibilities of D flip-flops possible with the logic cell; FIG. 5C is an explanation of the notation used in the list of FIG. 5B.

FIG. 11 details the long wiring segments in an array of tiles of FIG. 6.

FIG. 12A is a representation of a passive programmable connection between the long wiring segments of FIG. 11; FIG. 12B is a representation of an active programmable connection between the long wiring segments; FIG. 12C represents another active programmable connection.

DETAILED DESCRIPTION OF PREFERRED EMBODIMENTS

Figure 3A:
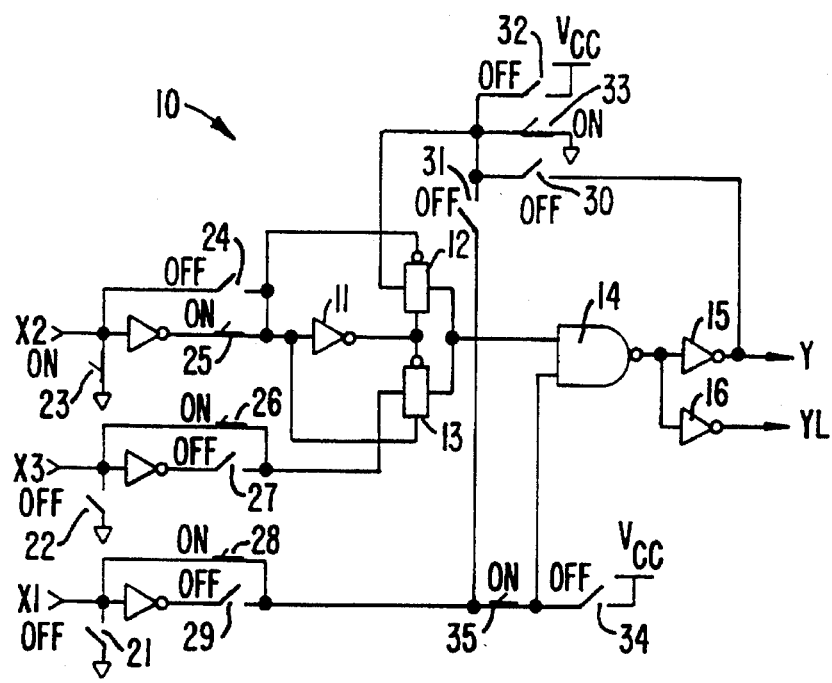
FIG. 3A is a diagram of the logic cell of FIG. 1A which has been programmed to operate as a 2-input AND logic gate.

FPGAs use either memory cells or antifuses for the programmable switches. Memory cells are reprogrammable and antifuses are programmable only once. The present invention is designed to be implemented with a new memory-type of programmable interconnect, as disclosed in a patent U.S. patent application No. 08/270,714, entitled, "A GENERAL PURPOSE, NON-VOLATILE REPROGRAMMABLE SWITCH," filed Jul. 5, 1994 by Robert J. Lipp, Richard D. Freeman, Robert U. Broze, John M. Caywood, and Joseph G. Nolan, III, and assigned to the present assignee. In the FPGA described in the patent application, a non-volatile reprogrammable transistor memory (NVM) cell is used to provide a general purpose switching element to randomly interconnect FPGA wiring and circuit elements. However, the present invention should not be considered limited to the disclosed programmable switch only. Other types of memory cells may be used for the programmable switches. Even an antifuse-based FPGA may benefit from the present invention.

Logic Cell

The present invention uses a logic cell 10, as shown in FIG. 1A. The logic cell 10 has a core 17, which is denoted by a dotted line. The core 17 has an inverter 11 which has an output node connected to the control nodes of two transfer gates 12 and 13. Each transfer gate is basically a PMOS and an NMOS transistor having a first common source/drain region forming the input node to the transfer gate and a second common source/drain region forming an output node of the transfer gate. The gate electrodes for the PMOS and NMOS transistors form the two control nodes. The output nodes of the transfer gates 12 and 13 are connected in common to an input node of a NAND gate 14. The output node of the NAND gate 14 is connected to input nodes of an inverter 15 and an optional inverter 16, which is connected in parallel to the first inverter 15. The inverters 15 and 16 act as buffers for the output signal from the NAND gate 14. The signals on the output nodes of the inverters 15 and 16 are the same and, for the remainder of this disclosure, are considered as the output signal on the output terminal Y of the logic cell 10. The second inverter 16 is used for particular loads on the wiring routing from the output terminal Y. This is explained below. It should be noted that the logic cell core 17 itself contains no programmable elements; rather, the input signals to the core are controlled by programmable switches located outside the core 17 to define the function of the cell 10.

The logic cell 10 has three input terminals, X2, X3, and X1, in descending order in the drawing. The input terminal X2 is connected to the input node of an inverter 43 which has its output node connected to the input node of the inverter 11 of the logic cell core by a programmable switch 25. By a programmable switch 23, the input terminal X2 is connectable to ground. By another programmable switch 24, the input terminal X2 is also connectable directly to the input node of the inverter 11. The input node of the inverter 11 is also connected to the PMOS gate electrode of the transfer gate 12 and the gate electrode of the NMOS transistor of the transfer gate 13.

The input terminal X3 is connected to the input node of an inverter 42, which has its output node connectable to the input terminal of the transfer gate 13 through a programmable switch 27. Through another programmable switch 26, the input terminal X3 is also connectable directly to the input node of the transfer gate 13. The input node X3 is also connectable to ground through a programmable switch 22.

The input terminal X1 is connected to the input node of an inverter 41 which has its output node connectable to the second input node of the NAND gate 14 through programmable switches 29 and 35. Through a programmable switch 28, which is connected in parallel to the inverter 41 and programmable switch 29, the input terminal X1 is directly connectable to the second input terminal of the NAND gate 14 through the programmable switch 35. The second input terminal of the NAND gate 14 is also capable of being pulled high (the positive power supply at $V_{CC}$) through a programmable switch 34. Similar to the previous input terminals X2 and X3, the input terminal X1 is also capable of being set low (the lower power supply at ground) by a programmable switch 21. The output terminal F from the inverter 15 is also connectable to the input node of the transfer gate 12 through a programmable switch 30. The input terminal of the transfer gate 12 is also capable of being set high by a programmable switch 32, or set low by a programmable switch 33. The input terminal of the transfer gate 12 is also connectable to the input terminal X1 through a programmable switch 31, which is connected between the programmable switches 28, 29, and 35.

A representation of the logic cell 10 as used in subsequent drawings is shown in FIG. 1B. While the other embodiments of the present invention have other number of input terminals, three input terminals are believed to be optimum based upon calculations of likely configurations. The cell 10 is much smaller than the cells of most of the present FPGAs. This allows a greater packing density, i.e., less area per cell, on the integrated circuit.

Nonetheless, the logic cell 10 has great versatility and is capable of performing many functions. The table in FIG. 2 illustrates the functions of the different programmable switches in the logic cell 10. With respect to the description for the programmable switch 31, it should be noted that the transfer gates 12 and 13 operate as a simple multiplexer. The input signal to the transfer gate 12 is described as the input signal A and the input signal to the transfer gate 13 as the input signal B.

By setting the various programmable switches which direct the input signals into the core portion 17 of the logic cell 10, the logic cell can perform many diverse functions. FIG. 3A illustrates the setting of the programmable switches so that the logic cell 10 operates as a two-input AND gate. The programmable switches are labelled as "ON" to make the connection, while they are labelled as "OFF" to indicate that the programmable switch remains open. The two AND gate inputs are the signals on the X1 and X3 input terminals. The programmable switches for the X2 input terminal, i.e., programmable switches 23 and 25, have been set to insure that the transfer gate 13 passes the signal on the input terminal X3 to the first input node of the NAND gate 14.

Figure 3B:
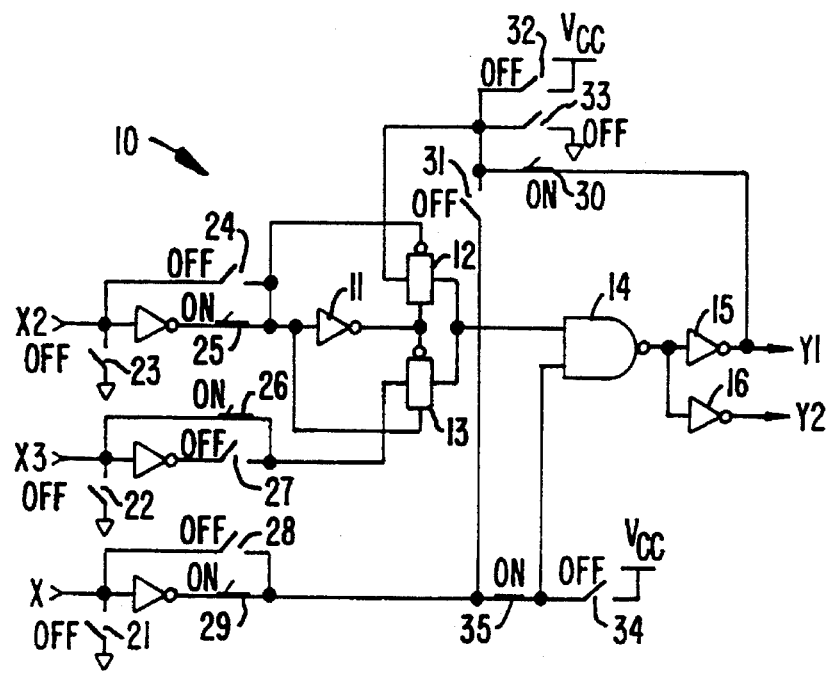
FIG. 3B is a diagram of the logic cell of FIG. 1A which has been programmed to operate as a D-latch with an active high Clear signal.

FIG. 3B illustrates another setting of the programmable switches so that the logic cell 10 operates as a D-latch with an active high clear (CLR) control signal. In this case, the data signal for the latch is received by the X3 input terminal and the clear signal by the X1 input terminal. The programmable switch 25 for the X2 input terminal is set to turn on the transfer gates 12 and 13. The programmable switch 30 is turned on for a feedback from the output terminal of the logic cell to complete the latch.

Figures 4A, 4B, 4C:
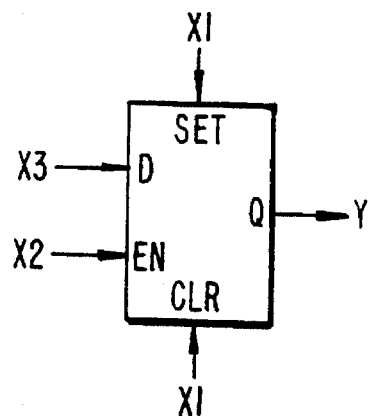
FIG. 4A represents the logic cell of FIG. 1A as a latch.
FIG. 4B is a list of 14 latch types possible with the logic cell.
FIG. 4C is an explanation of the notation used in the list of FIG. 4B.

The logic cell 10 can be configured to perform many other functions. FIG. 4A illustrates the logic cell 10 drawn as a latch. FIG. 4B is a list of 14 latch types which are possible with the logic cell 10, and FIG. 4C explains the latch-type notation used in FIG. 4B. Likewise, FIG. 5A is a representation of the logic cell 10 configured as a D-type flip-flop. FIG. 5B lists 28 different possibilities of D flip-flops which are possible with the logic cell 10. FIG. 5C explains the notation used to denote the different types of flip-flops in FIG. 5B.

Of course, if one logic cell 10 cannot be configured to perform the desired function, more than one cell may be connected together and programmed. To make these connections, the wiring of the FPGA comes into play.

As explained above, any placement and routing architecture of wiring between logic cells in an FPGA is a balance. If a designer has infinite line and switch resources, a full crossbar network which allows the output of every cell to access the input of every cell would be the best architecture. However, simple calculations indicate that the required number of programmable switches only would occupy an inordinate amount of space, even in a array with a moderate number of logic cells. Additionally, a calculation of the average switch utilization indicates that most of the switches would not be used. On the other hand, if a routing architecture is restricted so that each cell output can only be routed to a set of inputs of a single cell, nearly any circuit which would be desired by a user could not be configured.

The present invention minimizes the wiring resources, i.e., the wiring segments to and from the input and output terminals of the logic cells and the programmable switches for interconnecting the segments, with a maximization of the number of routable connections. The present invention achieves these goals by the use of overlapping windows of tiles, directional routing and programmable interconnecting tiles to make an extremely adaptable routing architecture. As used in this disclosure, the word "tile" refers to a logic cell and its associated wiring segments and programmable switches. An array of tiles forms the FPGA. In accordance with the present invention, the routing architecture of the tiles of the present invention are divisible into three components, local routing, long routing, and global routing.

Local Routing

In local routing, each 3×3 region of tiles overlaps in a manner such that the routing of the wiring segments in each tile are "self-similar" for each focal, i.e., center, tile in the 3×3 region. The focal tile moves with the 3×3 region, which can be anywhere in the array of tiles. The word "self-similar" means that the output of any focal tile can always reach the input of any other cell (including itself), in its 3×3 region of tiles by a unique, guaranteed route.

Figure 6:
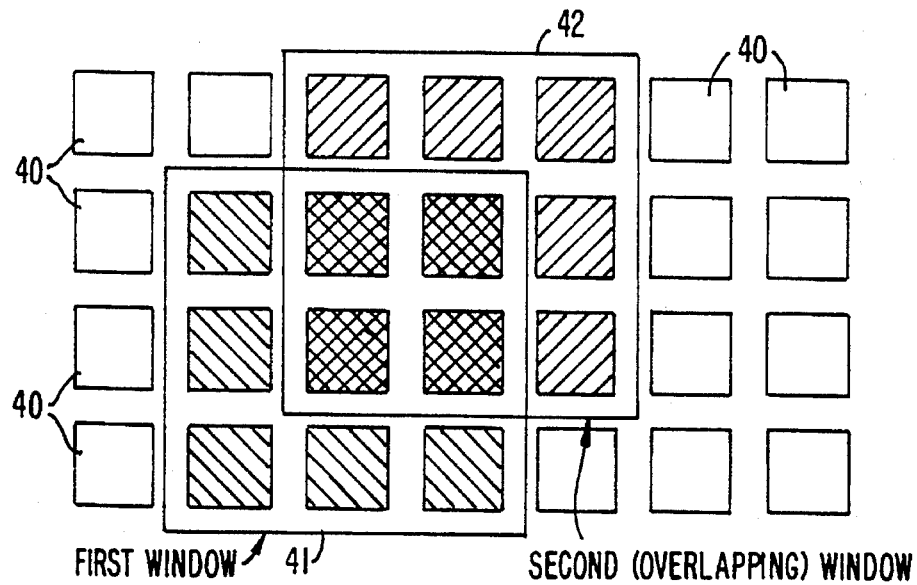
FIG. 6 illustrates an exemplary array of tiles, according to the present invention.

FIG. 6 illustrates this point with an exemplary array of tiles 40. As explained above, each tile 40 has a logic cell 10 and its associated wiring segments and programming switches. A solid line 41 closes a 3×3 region of tiles. The focal tile of this region is denoted F1. The output of the logic cell of F1 can reach the input of any logic cell of any tile in the region enclosed by the line 41 by a unique, guaranteed route. Likewise, if another 3×3 region is considered, here indicated by a solid line 42, with the focal tile of this region denoted F2, the output of the logic cell in F2 can reach the input of any logic cell within the region denoted by line 42 by a unique, guaranteed route. Note that the regions denoted by the lines 41 and 42 are overlapping and that every tile in the array (except for those at the periphery) are focal tiles.

Figure 7A:
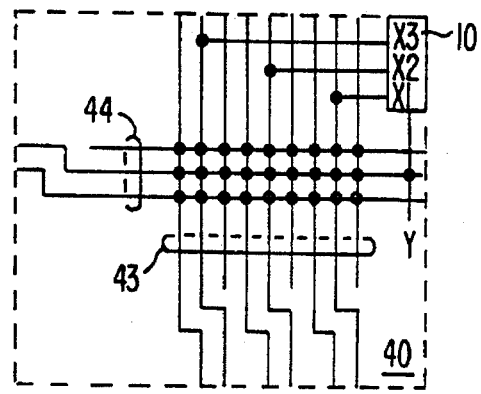
FIG. 7A illustrates local wiring segments in each tile of the array of FIG. 6.

FIG. 7A illustrates the local routing architecture of a single tile 40 according to one embodiment of the present invention. The input terminals X1, X2 and X3 of the logic cell 10 of the tile 40 are connected to three wiring segments, which are part of a set of nine vertical local wiring segments 43. The output terminal Y of the logic cell 10 is connected to one of the three horizontal local wiring segments 44. At the intersection of each of the vertical local wiring segments 43 and horizontal local wiring segments 44 are programmable switches, which are indicated by open circles. The local wiring segments 43 and 44 of adjacent tiles connect in an overlapping manner. For the horizontal local wiring segments 44, the top two segments at the right edge of the tile are connected to horizontal wiring segments 44 in horizontally adjacent tiles. Overlap occurs because in each tile, the bottom two segments become the two segments as one proceeds from right to left across the tile 40. For the vertical local wiring segments 43, six of the nine wiring segments are connected to segments 43 in vertically adjacent tiles. At the bottom of each tile 40, the six segments are the first, second, fourth, fifth, seventh and eighth from the left. Overlap occurs because in each tile 40 these segments were respectively the second, third, fifth, sixth, eight and ninth segments before reaching the bottom of the tile.

Figure 7B:
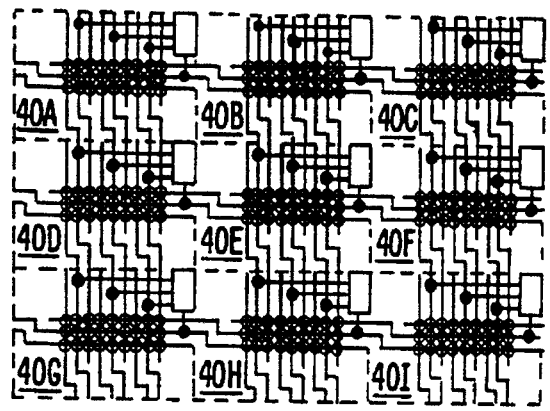
FIG. 7B illustrates the connections between the local wiring segments of FIG. 7A in an array of tiles.

These connections are better illustrated in FIG. 7B, which shows the connections of the local wiring segments 43 and 44 in a 3×3 tile region. The tile 40E is the focal tile of the region and its output terminal may be connected to any input terminal of a logic cell in any neighboring tile 40A–40D, 40F–40I, and itself through a single, unique programmable switch.

This concept of overlapping or sliding regions is extremely powerful and may be used at many levels of a hierarchial design. Each logic cell of a focal tile has a new set of routing resources identical to its neighbors. In this embodiment, the new wiring are guaranteed to be available. As noted above, the output of the logic cell of the focal tile can reach any or all of the 27 inputs of the neighboring logic cells, including itself. The ability to reach these nine cells gives substantially more routability than is found typically in the prior art, which only allowed local connections to the four adjacent orthogonal logic cells. In the present case, the placement of functions with specific logic cells is much less constrained and the percentage of routes which may be accomplished with local routing resources is larger. It should be noted that this very high percentage of connections substantially reduces the requirements for the "long" routing resources, which allowing these wiring resources to be more flexible since they form fewer connections. The present local routing is very area efficient, with a high percentage of connections made with local resources and the relatively small number of switches required. The switches for local routing tend to have very high utilization.

Figure 8:
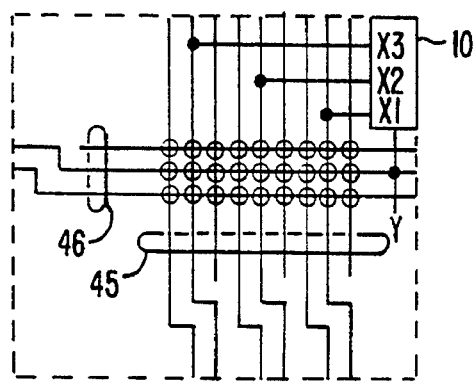
FIG. 8 shows a tile in which the output terminal of the logic cell is not connectable to its input terminals through local wiring segments, according to another embodiment of the present invention.

In another embodiment of local routing according to the present invention, each tile 40 has the same arrangement of vertical local wiring segments 45 and horizontal wiring segments 46, as shown in FIG. 7A. However, the three programmable switches at the intersections of the vertical wiring segments connected to the local cell input terminals X1, X2 and X3, and the horizontal wiring segment connected to the output terminal F have been eliminated, as shown in FIG. 8. In this embodiment, the output terminal of the logic cell of the focal tile may be connected to the input terminals of its eight adjacent neighbors, but not to the input terminals of its own logic cell. In typical applications there are very few signals which feed back to their own logic cell. If required, this feedback path may be implemented, either internally to the logic cell (note programmable switch 30 in FIG. 1A), or by the use of a long routing resource, discussed below.

Figure 9:
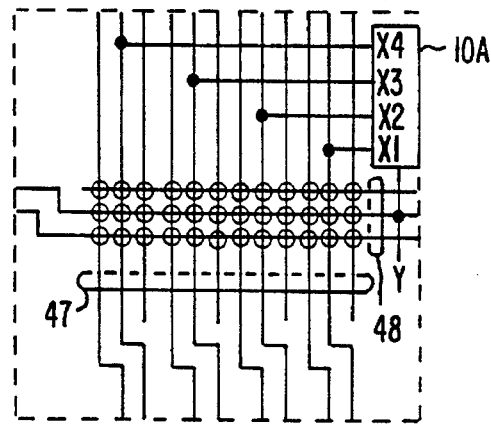
FIG. 9 shows the tile local wiring segments connected to a logic cell with four input terminals, according to another embodiment of the present invention.

The local routing is effective with logic cells with any number of input and output terminals. Though three inputs are considered optimal, other considerations may require otherwise. Local routing works equally well with 2, 4, 5, or other number of inputs per cell, or more than one output per cell. For example, FIG. 9 illustrates local routing with a logic cell 10A having four input terminals X1, X2, X3, X4, and a single output Y. In this case, there are twelve vertical local wiring segments 47, four of which are connected to one of the four input terminals X1, X2, X3, X4 of the logic cell 10. The horizontal local wiring segments 48 remain at three with the output terminal Y connected to one of the segments as before. Again, it should be noted that each local connection requires only one programmable switch. This contributes to the speed of the circuit implemented on this local "mesh" of wiring segments, since the interconnect speed is an inverse function of the number of programmable switches a signal traverses.

The local routing as described thus far has one drawback. If a local cell output terminal does not need a connection to an input terminal of cell in one of the tiles of the local region, that path is wasted. In the worst case, an unused logic cell leaves 27 unused paths. To correct this deficiency, the local routing architecture may be modified slightly so that the output terminal of a logic cell is not required to use the local wiring segments. This permits the local wiring segments to be used for other connections; routability in the architecture is increased.

Figure 10A:
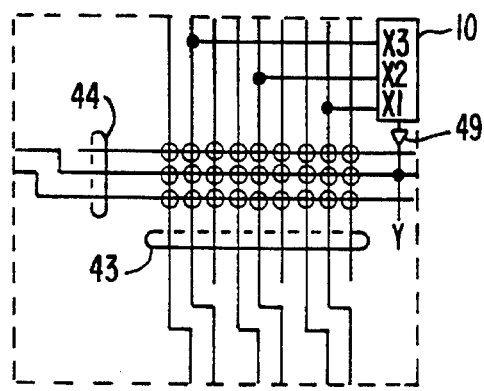
FIG. 10A shows the local wiring segments connected to a logic cell having a three-state buffer on the output terminal of the cell, according to still another embodiment of the present invention.
Figure 10B:
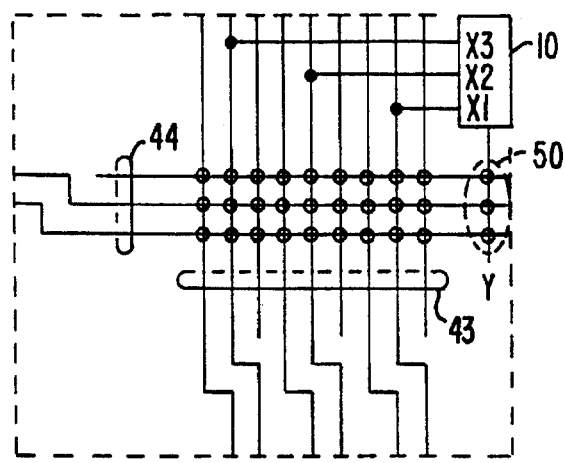
FIG. 10B shows the programmable switches at all the intersections between vertical and horizontal local wiring segments, according to a variation of the tile of FIG. 10A.

Different modifications are shown in FIGS. 10A and 10B. In FIG. 10A, a three-state driver 49 is added at the output terminal Y of the logic cell 10. The driver 49, is enabled or disabled by a programmable interconnect, not shown. When the driver 49 is disabled, the logic cell is effectively disconnected from the horizontal wiring segments 44. When the driver 49 is enabled, it drives the high or low logic signals from the logic cell 10 onto the connected horizontal wiring segment 44.

In the embodiment shown in FIG. 10B, rather than a fixed connection to a single segment of the three horizontal wiring segments 44, each of the horizontal wiring segments 44 are connectable to the output terminal Y of the logic cell 10 by programmable switches. A dotted line 50 encircles the programmable switches at the intersection of the output terminal Y and the horizontal wiring segments 44. Although this approach requires two programmable switches to make all local connections, the additional loading of the additional programmable switch is light and does not contribute greatly to signal delays.

Figure 10C:
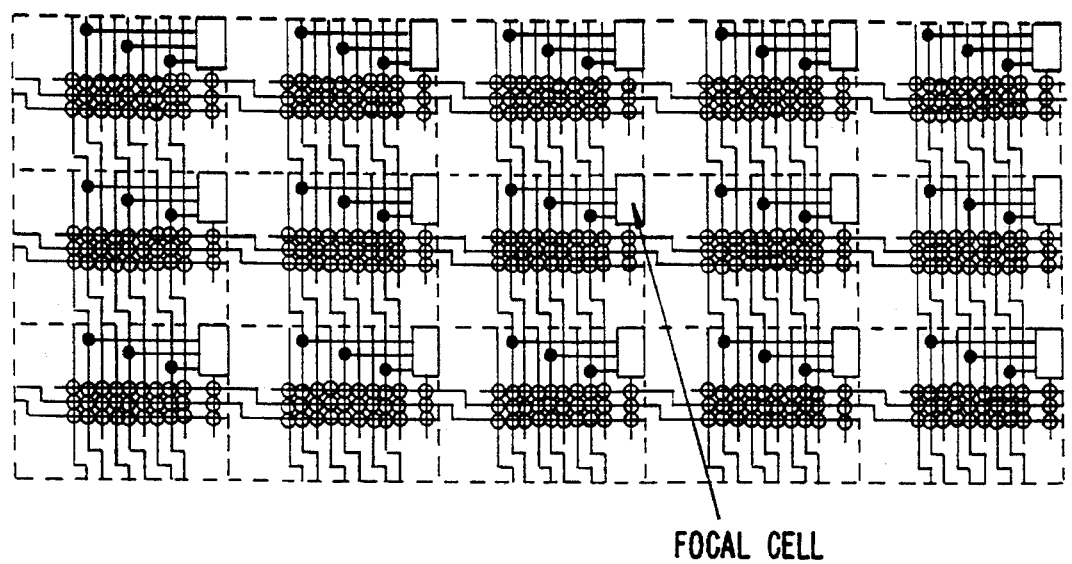
FIG. 10C details the local wiring segment connections in a 5×3 local region of FIG. 10B tiles.

Another benefit of this embodiment is that the output terminal of a focal cell is increased from 27 input terminals in a 3×3 tile region to 45 input terminals in a 5×3 tile region. A unique path from the output terminal of the focal cell to all input terminals in the surrounding 3×3 tile region is still guaranteed. Thus the benefits of the original embodiment are retained while the "reach" of the focal cell output is increased significantly. FIG. 10C illustrates the detailed local wiring segments in a 5×3 tile region with the focal cell of this region indicated.

With additional programmable interconnects, larger local tile regions may be assembled, e.g., 4×4, 5×5 and other regions. Moreover, these regions need not be square, such as 3×4, 4×5, 3×5 tile regions. Of course, each increased region increases the percentage of connections which can be made locally.

Long Routing Architecture

Beyond the local wiring segments, each of the tiles has additional programmable routing resources so that connections can be made to nodes outside the local regions. These so-called long routing resources are completely programmable and are not shared with the local wiring segments.

Approximately 66% of all routing can be made by the local routing resources; the remaining 33% can be performed by the long routing resources. As will become evident below, the long wiring segments of the present invention also allows better control over the maximum path length of connected wiring, and hence the timing of signals, compared to the prior art.

A traditional gate array with a similar capacity to the FPGA herein described requires approximately 9×12 tracks in the gate array's channels to attain 80% routability to all of the array's resources. Since 66% of the routing is being handled by the local routing resources of the FPGA of the present invention, only 3×4 tracks are required for long routing. To insure ample routability, slightly more long wiring segments are used.

As illustrated in FIG. 11, the present uses five horizontal long wiring segments 51 and five vertical long wiring segments 52, the long routing resources in each tile 40. The horizontal long wiring segments 51 are programmably connectable to the output terminal Y of the logic cell 10 of the tile by programmable switches, which are enclosed by a dotted box 60. The horizontal and vertical long wiring segments 51 and 52 are each programmably connectable by programmable switches, indicated by a dotted box 61 at the intersection of the vertical and horizontal long wiring segments. Each of the input terminals X1, X2, and X3 of the logic cell are connectable to the vertical wiring segments 52 by programmable interconnects enclosed by a dotted box 62.

At points where the long wiring segments 51 and 52 abut adjacent tiles, a programmable connection is placed. The state of the programmable connection determines whether a long wiring segment, vertical and horizontal, continues across to an adjacent tile. In FIG. 11, the programmable connections for the horizontal wiring segments 51 are enclosed by a dotted box 64; for the vertical wiring segments 52, the programmable connections are enclosed by a dotted box 63. These programmable connections allow for an optimal line length to be decided. As shown, every long wiring segment has a programmable connection at the boundary of each tile 40. This arrangement effectively implements a channel routing architecture like a traditional gate array routing with minimum waste.

The programmable connections for the long wiring segments are implemented in two general ways. The first is a passive programmable connection which is a single programmable switch which can interconnect two long wiring segments as shown in FIG. 12A. The other type of programmable connection is an active programmable connection, such as shown in FIG. 12B. The active programmable connection has two buffers 65 and 66 arranged in opposite directions. Two programmable switches 66 and 68 make the connection to the output nodes of the buffers 65 and 67. Thus, the connection is programmably bidirectional. If a programmable connection with only one buffer is required, an alternative is shown in FIG. 12C. A buffer 69 has two programmable switches 71 and 72, which make the connections to the input nodes of the long wiring segments on either side of the buffer 69. Programmable interconnects 73 and 74 make the connection to the output node of the buffer 69 to the long wiring segments.

Figure 13:
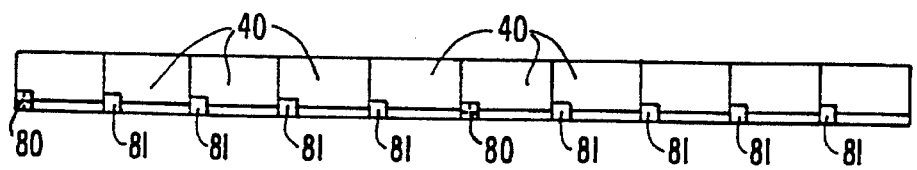
FIG. 13 shows a distribution of active and passive programmable connections for a long wiring segment through several tiles.

Area and line loading considerations dictate how combinations of these possible programmable connections may be implemented. For example, if only active programmable connections are used, much area of the integrated circuit is consumed by the programmable connections. With five vertical and five horizontal long wiring segments per tile and the programmable connections all being active, 20 extra buffers and 20 extra programmable switches dramatically increase the size of each tile. To avoid this problem, the active programmable connections for each long wiring segments may be distributed sparsely. An example is illustrated in FIG. 13. Each long horizontal wiring segment has an active programmable connection 80 every five tiles and intermediate passive programmable connections 81 in the other tiles. There are thus two buffers and two programmable switches for the horizontal long wiring segments 51 in each tile 40. The long vertical wiring segments 52 contribute two more programmable buffers and switches to each tile 40. Thus, only four buffers and four programmable switches are added per tile.

With this arrangement, the worst case number of programmable switches which (in the programmable connecting array) may be driven is five horizontally (the extra programmable switch occurs because the first switch is at the output of the buffer), and four on the vertical wiring segments. Thus, there is a total of nine programmable switches before another buffer is reached. If this loading is too much for the buffers, then the placement of the passive programmable connections may be arranged to occur every other cell. In other words, the long wiring segments stretch across two tiles vertically and horizontally. This makes the shortest long wiring segment a length of two tiles. If this is done, the maximum number of programmable switches is cut by one-half to five in the worst case. This makes some of the long wiring segments "hard wired" to lengths longer than one tile.

If an inverter is used for the buffer, the signal is inverted when it reaches the input terminal of the cell, if the signal has passed through an odd number of active programmable connections. The inverted signal may be corrected by programming the logic cell to invert the incoming signal. Alternatively, routing can be constrained to use paths with an even number of active programmable connections.

Figure 14:
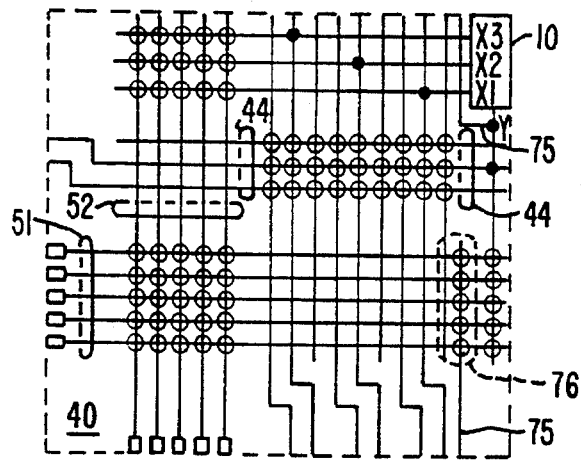
FIG. 14 illustrates one technique of avoiding blockages on the long wiring segments in accordance with the present invention.

Blocked routing is a major problem associated with all routing architectures. In the present invention, there are several ways to reduce or bypass blocked long routing. One technique is illustrated in FIG. 14. Instead of being only connectable to the long wiring segments 51 in its own tile, the output terminal F of a logic cell 10 is also connected to the long wiring segments of an adjacent tile. FIG. 14 illustrates a wiring segment 75 which is connected to the output terminal of the logic cell 10. (The extra load of the segment 75 may be handled by the parallel-connected inverter 16 shown in FIG. 1B.) The segment 75 extends upward into the tile above to intersect the horizontal long wiring segments 51 of that tile. FIG. 14 illustrates how the wiring segment 75 from the tile below which extends upwardly to cross the horizontal long wiring segments 51. There are programmable switches surrounded by a dotted ellipse 76, at the intersection of the wiring segment 75 and horizontal long wiring segments 51.

Figure 15:
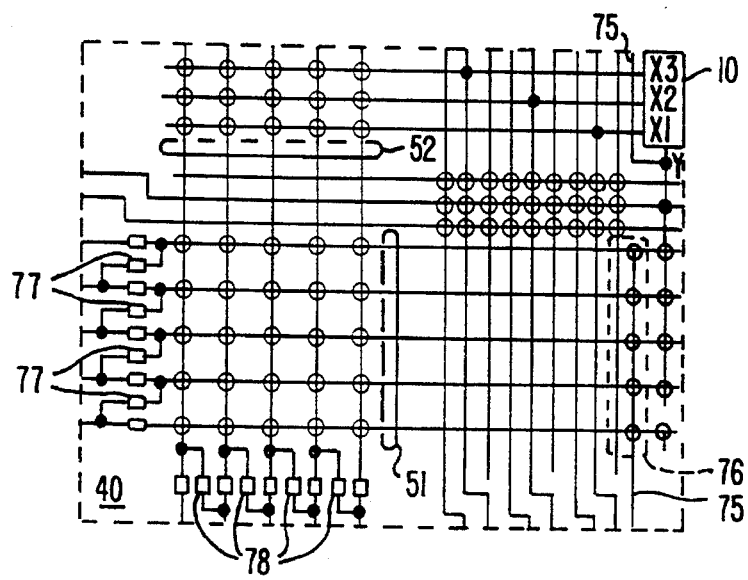
FIG. 15 illustrates another technique of avoiding blockages on the long wiring segments in accordance with the present invention.

Another way of avoiding blockages allows signals to move from one long wiring segment to another non-corresponding long wiring segment in another tile. FIG. 15 illustrates programmable connections 77 for the long horizontal wiring segments and programmable connections 78 for the long vertical wiring segments 52. Each programmable connection 77 and 78 allows a signal on its respective long wiring segment to "shuffle" over to a neighboring non-corresponding long wiring segment in the adjacent tile. For example, a signal on the top horizontal wiring segment 51, can be shuffled over to the second long horizontal wiring segment at the tile boundary, if there is a conflict or blockage with the top wiring segment in the adjacent tile. These programmable connections 77 and 78 may be bidirectional or oriented to drive signals in one direction or another. It should be evident that these programmable connections do not necessarily have to make connections between neighboring wiring segments.

Still another way of reducing blockages is to reduce the directionality of these programmable connections. That is, as previously described and shown, programmable connections are made between a horizontal long wiring segment to a vertical long wiring segment or vice versa. Thus, the long wiring connections are only allowed to be "L-shaped" and give very predictable timing. The selection of wiring segments is sufficient to know the routing and length of the segments. By relaxing the directionality of the wiring segments, the connection can be zig-zagged from the source to the destination. This allows freedom to move from a different row and column if the desired one is too congested. This is very similar to that of a router for a traditional channelled gate array and the same type of optimization may be realized.

Figure 16A:
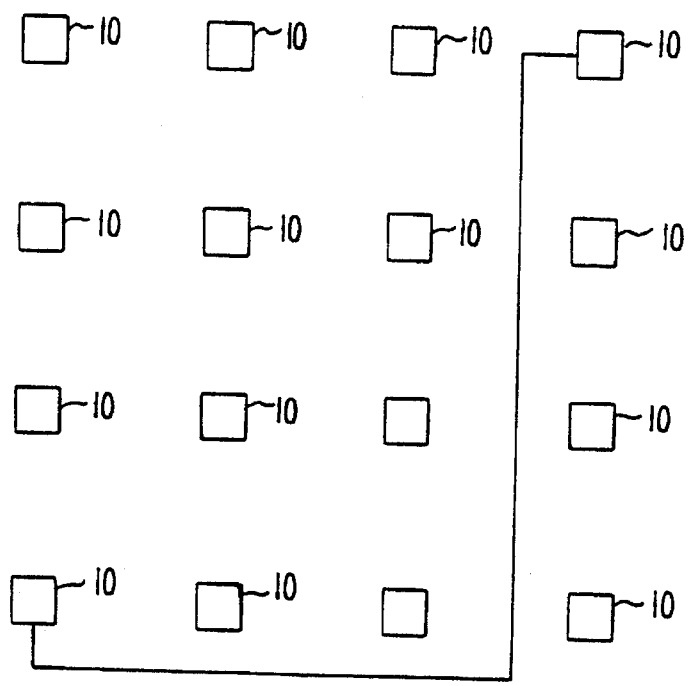
FIG. 16A illustrates a connection between two logic cells in an array of such cells with a horizontal long wiring segment and a vertical long wiring segment.
Figure 16B:
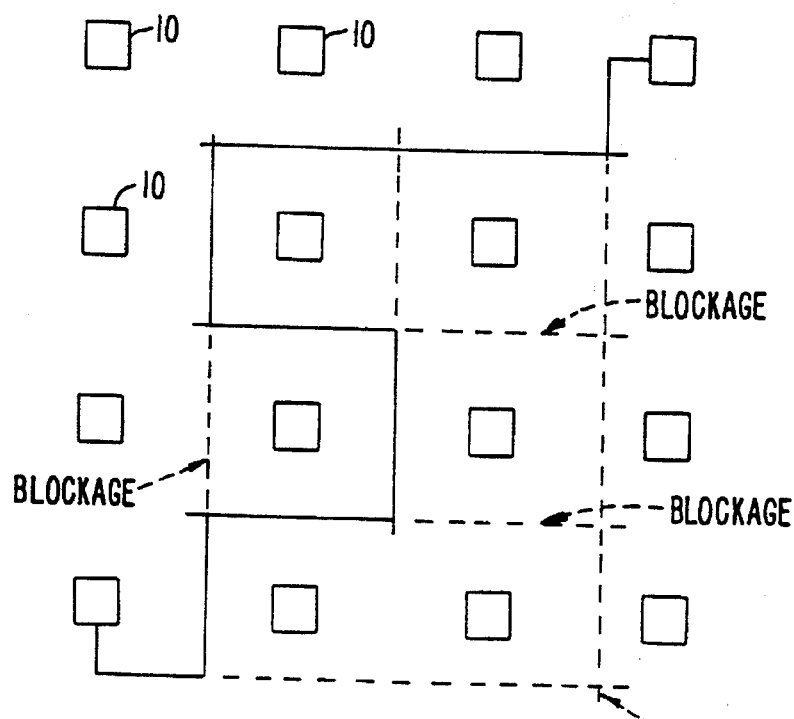
FIG. 16B illustrates a zig-zaged connection between the two logic cells with a more complex combination of long wiring segments.

FIGS. 16A and 16B illustrate this point. FIG. 16A illustrates an array of logic cells 10 in which two logic cells are connected by a horizontal long wiring segment and a vertical long wiring segment. A typical "L-shape" is formed by the two connected long wiring segments. FIG. 16B illustrates a zig-zaged connection between the two logic cells. This connection avoids blockages, shown by dotted lines, which prevent the connection of FIG. 16A and other possible connection routes.

Global Routing

The wiring for global signals, such as clock signals, presents a difficult problem because there is typically no prior knowledge of where the global signals are required to go. The present invention partially solves this problem by designating each of the input terminals of the logic cell 10 for specified global signals. The input terminal X2 may be used to receive a global block signal, the input terminal X1 for a global reset signal, and the input terminal X3 may be used for either clock or multiplexer select signals. Furthermore, the wiring used to carry global signals is separated from both the local and long wiring segments and the number of programmable switches for the global wiring is limited. Finally, the array of tiles is partitioned into sections by the global wiring which allow different sections to select how the global wiring in that section is to be utilized.

There are four global wires for the array. These wires are driven either from external pads or are internally generated. Each of these wires may be connected to the X2 input terminal of each logic cell in the array. Additionally, through a programmable switch, one of the four global wires may be selected to be connected to the X1 input terminal of every logic cell within an array section.

Figure 17:
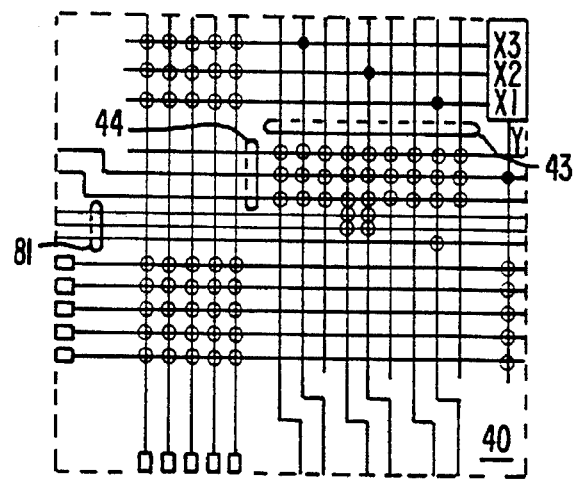
FIG. 17 shows the horizontal global lines through a tile for the distribution of global signals through the array of tiles, according to the present invention.
Figure 18:
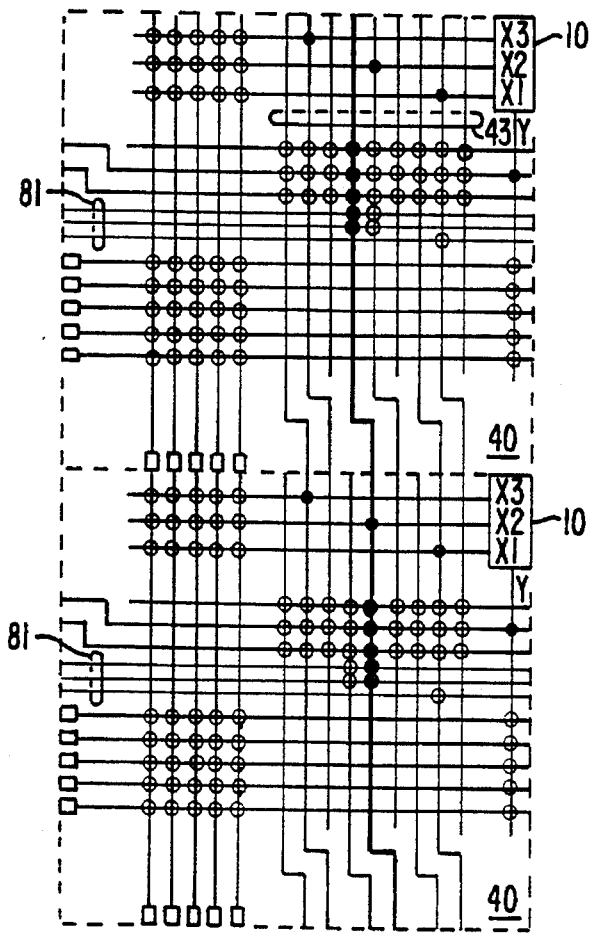
FIG. 18 illustrates how two vertically adjacent tiles are connectable to the horizontal global lines in one of the tiles of FIG. 16.

As shown in FIG. 17, each tile 40 has three global lines 81 running horizontally through it. The top two lines are connected to two of the possible four global wires. These horizontal lines 81 are connectable to the X2 input terminals of two vertically adjacent tiles through programmable switches. That is, the X2 input terminal of the logic cell 10 containing the global lines 81 and the X2 input terminal of the logic cell 10 in the tile immediately below may be connected to the horizontal global lines 81 of the first tile. Similarly, the tile below has a similar set of horizontal global lines 81 which are connected to the other two of the four main global lines. These lines 81 are connectable to the X2 input terminal of the logic cell 10 of that tile 40, and connectable to the input terminal of the logic cell in the tile below. This pattern is repeated throughout the array so that the top two of the horizontal lines 81 may be connected to any four of the global signals. FIG. 18 illustrates how two vertically adjacent tiles are connectable to the top two lines of the horizontal global lines 81 by the darkened vertical wiring segment 82, one of the local vertical wiring segments 43.

The bottom line of the horizontal global lines 81 is connectable to the X1 input terminal of the logic cell in that tile only.

Figure 19:
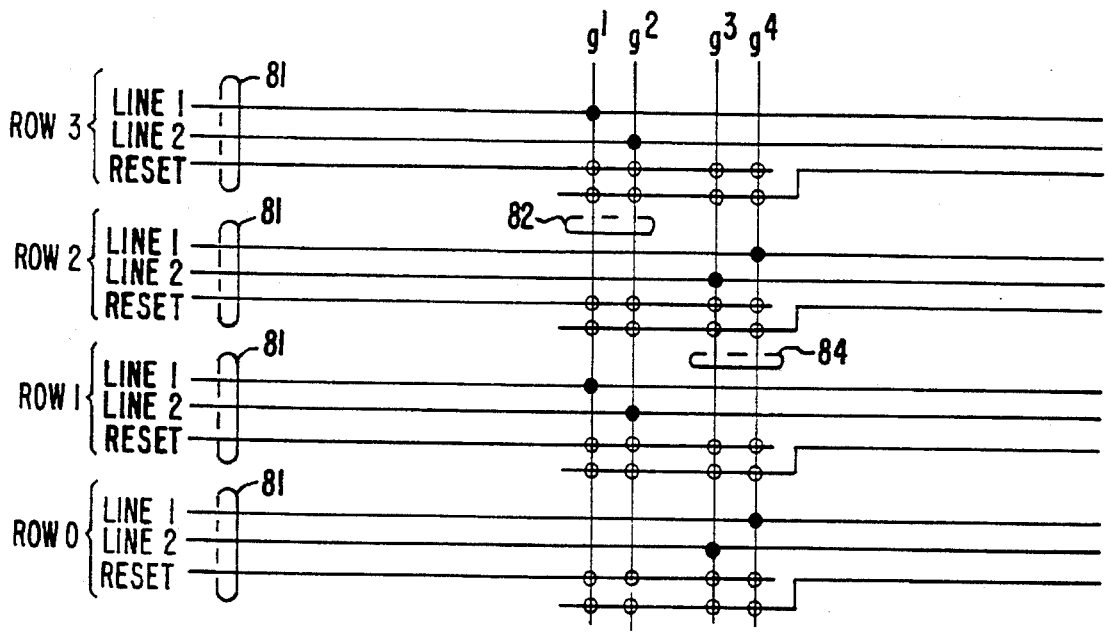
FIG. 19 shows how the horizontal global lines are connected to vertical global lines to form a global wiring network for an array of tiles.
Figure 20:
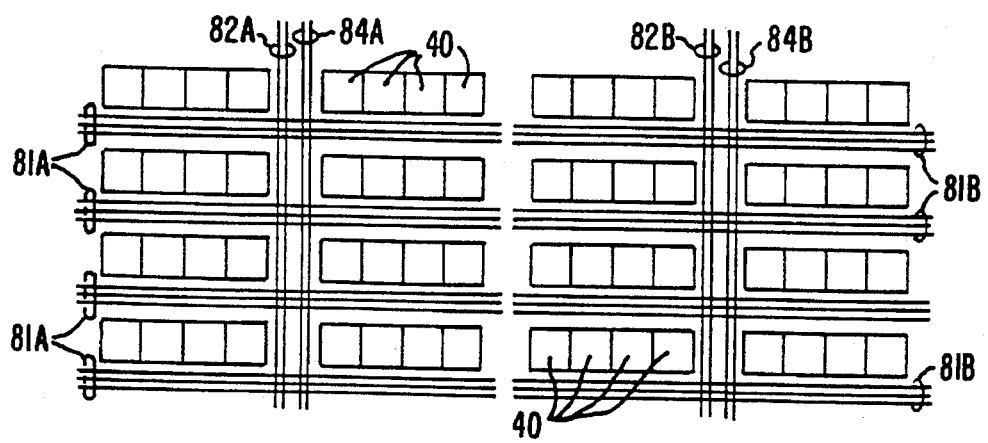
FIG. 20 illustrates the division of horizontal and vertical global lines into a sector for multiple and separate global networks in the tile array.

In the array, the global lines distribute signals through spines formed by vertical global lines 82 and 83, as shown in FIG. 19. From the pair of global lines 82 and the pair of global lines 84, four global signals may be distributed through the network. Each pair of vertical global lines 82 and 84 drives one pair, i.e., the top two lines, of the horizontal global lines 81 in alternate rows. The bottom line in the global lines 81 is connectable to any one of the four lines in the lines 81 and 84. As shown in FIG. 19, the lines 81 extend horizontally on either side of the vertical global lines 82 and 84. Each of the set of vertical lines 82 and 84 with the horizontal extensions of the lines 81 cover a sector of the array of tiles. This is shown in an example in FIG. 20, in which the global lines are labelled with the suffix A on the left sector, and the suffix B on the right sector. This allows the global distribution of signals to be designed so that the required skew characteristics of the signals may be met.

While the above is a complete description of the preferred embodiments of the present invention, various alternatives, modifications and equivalents may be used. It should be evident that the present invention is equally applicable by making appropriate modifications to the embodiment described above. For example, Therefore, the above description should not be taken as limiting the scope of invention which is defined by the metes and bounds of the appended claims.

What is claimed is:

1. In an integrated circuit having a plurality of logic cells, interconnect lines and switches for programmably connecting said logic cells and interconnect lines, each logic cell comprising first and second transfer gates, each transfer gate having an input node, control terminals programmably connectable to a first true or inverted signal, or to a fixed logic level, and an output node connected in common to said other transfer gate, an input node of said first transfer gate programmably connectable to a fixed logic level or an output signal from said logic cell, an input node of said second transfer gate programmably connectable to a second true or inverted signal, or to a fixed logic level; and a logic gate having a plurality of input nodes, a first input node connected to said commonly connected output nodes of said transfer gates and a second input node programmably connectable to a third true or inverted signal, or to a fixed logic level, and an output node for generating said logic cell output signal;

whereby said logic cells, individually or severally, may be programmed to provide logic or memory functions to configure said integrated circuit.

2. The logic cell of claim 1 wherein said fixed logic level comprises either a logic "1" or a logic "zero" voltage level.

3. The logic cell of claim 2 wherein said fixed logic level comprises either a first voltage supply level or a second voltage supply level.

4. The logic cell of claim 2 wherein said logic gate comprises a NAND logic gate.

5. The logic cell of claim 4 further comprising a pair of inverters, each inverter having an input node connected to said logic gate output node and an output node connected to separate interconnect lines.

6. The logic cell of claim 1 wherein each of said transfer gates comprises an NMOS transistor and a PMOS transistor, each transistor having a first source/drain connected to said input node of said transfer gate and a second source/drain connected to said output node of said transfer gate, and a gate forming a control terminal of said transfer gate.

7. The logic cell of claim 6 further comprising an inverter having an input node programmably connectable to said first true or inverted signal, or to a fixed logic level, and an output node connected to a gate of an NMOS transistor of said first transfer gate and to a gate of a PMOS transistor of said second transfer gate.

8. The logic cell of claim 1 wherein said first true or inverted signal comprises a clock signal.

9. The logic cell of claim 1 wherein said second true or inverted signal comprises a data signal.

10. The logic cell of claim 1 wherein said third true or inverted signal comprises a set/reset signal.

11. In an integrated circuit having an array of tiles, each tile comprising a logic cell having input and output terminals;

a plurality of interconnect lines between contiguous tiles in said array;

a plurality of switches for programmably connecting said interconnect lines and said input and output terminals of said logic cell;

said interconnect lines arranged such that an output terminal of said logic cell is uniquely programmably connectable to each input terminal of a logic cell in each contiguous tile.

12. The tile of claim 11 wherein said output terminal of said logic cell is uniquely programmably connectable to each input terminal of a logic cell in each contiguous tile, including itself.

13. The tile of claim 12 wherein said output terminal of said logic cell is uniquely programmably connectable to each input terminal of a logic cell in each contiguous tile by a single switch.

14. The tile of claim 11 wherein each logic cell of each tile comprises three input terminals.

15. The tile of claim 11 wherein each logic cell of each tile comprises one output terminal.

16. The tile of claim 11 wherein each logic cell of each tile comprises three input terminals and one output terminal; and said interconnect lines comprise a first set of three interconnect lines generally aligned in a first direction, each logic cell output terminal connected to one of said first set interconnect lines;

a second set of nine interconnect lines generally aligned in a second direction perpendicular to said first direction, each of said second set interconnect lines intersecting and programmably connectable to each of said first set interconnect lines, each logic cell input terminal connected to one of said second set interconnect lines.

17. The tile of claim 11 wherein each logic cell of each tile comprises three input terminals and one output terminal; and said interconnect lines comprise a first set of three interconnect lines generally aligned in a first direction, each logic cell output terminal programmably connectable to each one of said first set interconnect lines;

a second set of nine interconnect lines generally aligned in a second direction perpendicular to said first direction, each of said second set interconnect lines intersecting and programmably connectable to each of said first set interconnect lines, each logic cell input terminal connected to one of said second set interconnect lines.

18. The tile of claim 11 wherein said interconnect lines comprise a first set of interconnect lines generally aligned in a first direction, each logic cell output terminal connected to one of said first set interconnect lines;

a second set of interconnect lines generally aligned in a second direction perpendicular to said first direction, each of said second set interconnect lines intersecting and programmably connectable to each of said first set interconnect lines, each logic cell input terminal connected to one of said second set interconnect lines.

19. The tile of claim 11 wherein said interconnect lines comprise a first set of interconnect lines generally aligned in a first direction, each logic cell output terminal connected to one of said first set interconnect lines though a three-state driver circuit so that said output terminal is programmably connectable to said one first set interconnect line;

a second set of interconnect lines generally aligned in a second direction perpendicular to said first direction, each of said second set interconnect lines intersecting and programmably connectable to each of said first set interconnect lines, each logic cell input terminal connected to one of said second set interconnect lines.

20. The tile of claim 11 wherein said interconnect lines comprise a first set of interconnect lines generally aligned in a first direction, each logic cell output terminal programmably connectable to each one of said first set interconnect lines;

a second set of interconnect lines generally aligned in a second direction perpendicular to said first direction, each of said second set interconnect lines intersecting and programmably connectable to each of said first set interconnect lines, each logic cell input terminal connected to one of said second set interconnect lines.

21. The integrated circuit having an array of tiles, each tile comprising a logic cell having input and output terminals;

a plurality of interconnect lines;

a plurality of switches for programmably connecting said interconnect lines and said input and output terminals of said logic cell;

a first set of said interconnect lines generally aligned in a first direction, each logic cell output terminal programmably connectable to each one of said first set interconnect lines;

a second set of interconnect lines generally aligned in a second direction perpendicular to said first direction, each of said second set interconnect lines intersecting and programmably connectable to each of said first set interconnect lines, each logic cell input terminal programmably connectable to each one of said second set interconnect lines, wherein each of said first set interconnect lines in each tile is programmably interconnectable with its corresponding first set interconnect line in contiguous tiles and a non-corresponding first set interconnect line in contiguous tiles, and each of said second set of interconnect lines in each tile is also programmably interconnectable with its corresponding second set interconnect line in contiguous tiles, and a non-corresponding second set interconnect line in contiguous tiles.

22. The integrated circuit of claim 21 wherein said logic cell of each tile has a single output terminal.

23. The integrated circuit of claim 21 wherein each interconnect line is programmably interconnectable by a plurality of buffers through contiguous tiles.

24. The integrated circuit of claim 23 wherein said plurality of buffers are spaced apart along said interconnect line in contiguous tiles a predetermined number of tiles from each other.

25. The integrated circuit of claim 24 wherein said plurality of buffers are spaced apart along said interconnect line in contiguous tiles every other tile from each other.

26. The integrated circuit of claim 24 wherein said plurality of buffers are spaced apart along said first set interconnect line in contiguous tiles every five tiles from each other, and said plurality of buffers are spaced apart along said second set interconnect line in contiguous tiles every four tiles from each other.

27. The integrated circuit of claim 21 wherein each output terminal of logic cell of each tile is programmably connectable to each one of said first set interconnect lines of a contiguous tile.

28. An integrated circuit having a plurality of logic cells arranged in rows and columns, each logic cell having input and output terminals, said integrated circuit comprising first interconnect lines running through said array parallel to said columns;

second interconnect lines running through each row of said logic cells perpendicular to and intersecting said first interconnect lines, said second interconnect lines in a row programmably connectable to at least one of said input terminals of each logic cell in said row, and to at least one of said input terminals of each logic cell in a neighboring row;

said second interconnect lines alternately programmably connectable to first and second sets of said first interconnect lines in alternating rows of said logic cells;

whereby each logic cell is programmably connectable through said one input terminal to any of said first interconnect lines.

29. The integrated circuit of claim 28 further comprising third interconnect lines running through each row of said logic cells perpendicular to and intersecting said first interconnect lines, said third interconnect lines in a row programmably connectable to at least a second input terminal of each logic cell in said row and programmably connectable to any first interconnect line whereby each logic cell is programmably connectable to each logic cell through said second input terminal to any of said first interconnect lines.

30. The integrated circuit of claim 28 wherein said second interconnect lines are programmably connectable to said first interconnect lines at intersections of said first and second interconnect lines, said second interconnect lines in a row programmably connectable to an equal number of logic cells through said one input terminal on each side of an intersection with said first interconnect lines.

31. The integrated circuit of claim 28 wherein a plurality of logic cells arranged in rows and columns comprise a sector of logic cells, said integrated circuit comprising a plurality of said sectors to form an array of logic cells.

32. The integrated circuit of claim 28 wherein at least one of said first interconnect lines carry clock signals.

33. The integrated circuit of claim 32 further comprising a plurality of conducting pads, at least one of said conducting pads receiving clock signals, said one of said first interconnect lines connected to said one conducting pad to carry said clock signals.

34. The integrated circuit of claim 28 wherein said first interconnect lines comprise four lines and said second interconnect lines comprise two lines in each row of logic cells.

35. The integrated circuit of claim 34 wherein said third interconnect lines comprise one line in each row of logic cells.

* * * * *